(12) United States Patent
Wang et al.

(10) Patent No.: US 12,733,138 B2
(45) Date of Patent: Sep. 8, 2026

(54) HEAT DISSIPATION HOUSING FOR AC POWER ADAPTER

(71) Applicant: Delta Electronics (Shanghai) Co., Ltd., Shanghai (CN)

(72) Inventors: Wenshuai Wang, Shanghai (CN); Xiaojun Chen, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 174 days.

(21) Appl. No.: 18/166,494

(22) Filed: Feb. 9, 2023

(65) Prior Publication Data

US 2023/0345679 A1 Oct. 26, 2023

(30) Foreign Application Priority Data

Apr. 20, 2022 (CN) ......................... 202210420003.5

(51) Int. Cl.
*H05K 7/20* (2006.01)

(52) U.S. Cl.
CPC ......... *H05K 7/209* (2013.01); *H05K 7/20436* (2013.01)

(58) Field of Classification Search
CPC ........................... H05K 7/20436; H05K 7/209
See application file for complete search history.

(56) References Cited

U.S. PATENT DOCUMENTS 6,930,883 B2 * 8/2005 Hsieh ................ H05K 7/20909 361/695
7,239,519 B2 * 7/2007 Guo .................. H05K 7/20509 361/818
8,842,437 B2 * 9/2014 Chang ..................... G06F 1/181 361/704
9,730,677 B2 * 8/2017 Davidsen ............ G01S 7/52096
10,608,420 B2 * 3/2020 Nagano .................. H05K 7/209
10,673,106 B2 * 6/2020 Suzuki .................. H01M 10/46
11,474,219 B2 * 10/2022 Otsuka ................... A61B 8/546
2004/0008532 A1 * 1/2004 Asawa ............... H01R 13/5216 363/146
2007/0053157 A1 * 3/2007 Huang ............... H05K 7/20509 361/688
2010/0142154 A1 * 6/2010 Collet ................ H05K 7/20454 361/714
2012/0147565 A1 * 6/2012 I ......................... H05K 7/20409 361/720
2012/0191027 A1 * 7/2012 Campbell ............... A61L 15/42 602/43

(Continued)

FOREIGN PATENT DOCUMENTS

AT 400016 B * 7/1995 ............ B28B 19/00
CN 202352668 U 7/2012

(Continued)

*Primary Examiner* — Robert J Hoffberg
(74) *Attorney, Agent, or Firm* — CKC & Partners Co., LLC

(57) ABSTRACT

The present disclosure provides a heat dissipation housing for an AC power adapter, including a housing and a heat sink disposed on an inner surface of the housing, and integrally formed with the housing. The heat sink includes an upper surface which is in close contact with the housing, and a lower surface which is exposed to the inside of the heat dissipation housing. The heat sink includes at least one securing structure which is formed by the upper surface of the heat sink.

9 Claims, 7 Drawing Sheets

(56) References Cited

U.S. PATENT DOCUMENTS

| | | | | |
|---|---|---|---|---|
| 2014/0058270 | A1* | 2/2014 | Davidsen | A61B 8/4494 600/459 |
| 2018/0338386 | A1* | 11/2018 | Chen | H05K 9/0047 |
| 2019/0162832 | A1* | 5/2019 | Otsuka | G01S 7/52079 |
| 2025/0374491 | A1* | 12/2025 | Lin | H05K 7/209 |

FOREIGN PATENT DOCUMENTS

| | | | | | |
|---|---|---|---|---|---|
| CN | 203984226 | U | | 12/2014 | |
| CN | 207637055 | U | | 7/2018 | |
| CN | 210490739 | U | | 5/2020 | |
| CN | 210641227 | U | | 5/2020 | |
| CN | 212519758 | U | | 2/2021 | |
| CN | 112721026 | A | | 4/2021 | |
| CN | 214014695 | U | | 8/2021 | |
| DE | 10014457 | B4 | * | 2/2005 | H05K 5/064 |
| EP | 1006766 | A2 | * | 6/2000 | H01L 23/36 |
| JP | 2002299700 | A | * | 10/2002 | F21V 31/00 |
| KR | 20220032901 | A | * | 3/2022 | H01M 10/6551 |
| TW | 201225450 | A | | 6/2012 | |
| TW | 201404286 | A | | 1/2014 | |
| TW | 201828798 | A | | 8/2018 | |
| WO | WO-2021193587 | A1 | * | 9/2021 | |

* cited by examiner

HEAT DISSIPATION HOUSING FOR AC POWER ADAPTER

CROSS REFERENCE TO RELATED APPLICATION

This application claims the benefit of priority to Chinese Application No. 202210420003.5, filed on Apr. 20, 2022, the content of which is incorporated herein by reference in its entirety.

BACKGROUND OF THE INVENTION

1. Field of the Invention

The present disclosure relates to a field of heat dissipation in electronic products, and in particular to a heat dissipation housing for an AC power adapter.

2. Related Art

With a volume of an AC adapter getting smaller and smaller, and power density getting higher and higher, it becomes a challenge to dissipate heat more efficiently. In order to offer end users a better experience and increase service life of products, it is demanded to reduce a temperature rise in the AC adapter as much as possible. For an AC adapter with a high power density, there are commonly two conventional solutions for suppressing the temperature rise in the product housing.

A first solution is to attach metal heat sinks around an electronic assembly. Specifically, the metal heat sink may be fixed on a surface of an element in the electronic assembly that generates heat. The heat generated by the internal element may be transferred to a plastic housing through the metal heat sink, which in turn radiates the heat into the air to achieve the heat dissipation. However, due to an assembly gap between the metal heat sink and the plastic housing, and a larger thermal resistance of the plastic housing, the heat dissipation is poor. As the volume of the AC adapter becomes smaller, the arrangement of internal elements becomes more compact, a space for attaching metal heat sinks becomes more limited. As a result, the heat dissipation efficiency in the AC adapter is not desirable.

A second solution is to fill up all or most of the cavity in the AC adapter with heat dissipation adhesive having a good fluidity. However, the adhesive material having a good fluidity may flow into a lower part of the AC adapter by gravity, making it difficult to control the filling efficiency of the heat dissipation adhesive. Furthermore, a stress generated when the heat dissipation adhesive solidifies will impose a negative impact on the internal electronic elements. Accordingly, this solution is complex and difficult to control.

SUMMARY OF THE INVENTION

In view of the shortcomings of the above existing technologies, the present disclosure aims to provide a heat dissipation housing for an AC power adapter, to achieve efficient heat dissipation even in the AC adapter having a smaller volume and a higher power density.

To achieve the above objects, the present disclosure provides the following technical solutions In a first aspect, a heat dissipation housing for an AC power adapter includes a housing and a heat sink. The heat sink is disposed on an inner surface of the housing and is integrally formed with the housing. The heat sink includes an upper surface and a lower surface. The upper surface is in close contact with the housing, and the lower surface is exposed to the inside of the heat dissipation housing. The heat sink includes at least one securing structure which is formed by the upper surface of the heat sink.

In a second aspect, an AC power adapter, including a heat dissipation housing for the AC power adapter, is provided, which further includes: a power supply assembly disposed inside a cavity formed by the heat dissipation housing and including a circuit board and electronic element arranged on the circuit board; and an inner heat sink disposed on a periphery of the power supply assembly and secured to the power supply assembly.

As compared with the prior art, the present disclosure has the following beneficial advantages and effects:

The heat dissipation housing for the AC power adapter according to the present disclosure provides a groundbreaking solution in the field of heat dissipation for the AC adapter, which provides a heat dissipation housing structure with better heat dissipation effects, and solves a problem of overheating in the housing of the power adapter. To implement a structure with increased heat dissipation area and enhanced heat dissipation capability, a scheme in which a metal heat sink is embedded into a plastic housing is adopted. The metal heat sink and the plastic housing may be integrally formed, for example by injection molding, to achieve a better heat dissipation capability. Further, the embedded metal heat sink is provided with a securing structure for preventing the metal heat sink from falling off, combining the metal heat sink with the plastic housing more tightly, and thus improving structural stability of the heat dissipation housing.

Further, the heat dissipation housing for the AC power adapter according to the present disclosure has a high thermal conductivity. As compared with conventional plastic housings, since the metal heat sink having a lower thermal resistance is embedded, heat conduction efficiency is improved, allowing to transfer the heat around from local hot spots, and thereby improving temperature homogeneity over the surface of products. In this way, the heat generated by electronic element may be transferred to the outside effectively through the heat dissipation housing.

Further, there is a larger contact area between the heat sink and the housing in the heat dissipation housing for the AC power adapter according to the present disclosure. The heat sink embedded in an inner wall of the housing may have a plate shape or a cylinder shape. Part of the contact surface between the heat sink and the housing may be uneven, e.g., formed by protrusions and/or grooves with various shapes. By using the heat sink with uneven surface, a heat dissipation area of the heat sink may be increased such that a contact area between the heat sink and the housing may be increased, which increases heat transferring efficiency and enhancing heat dissipation capability of the heat dissipation housing.

BRIEF DESCRIPTION OF THE DRAWINGS

To describe the technical solutions in the embodiments of the present disclosure more clearly, the drawings necessary for illustrating the embodiments will be introduced briefly below. It is obvious that the drawings described below only illustrates some examples of the present disclosure. For those skilled in the art, other drawings may be derived from those drawings without further inventive efforts.

FIG. 10 is a structural diagram showing the inner heat sink in an embodiment of the present disclosure, in which:

1'—Plastic Housing;
2'—Metal Heat Sink;
3'—Electronic Assembly;
1—Housing;
2—Heat Sink;
21—Protrusion;
23—Barb Structure;
3—Power Supply Assembly;
4—Inner Heat Sink;
41—First U-Shaped Heat Sink;
42—Second U-Shaped Heat Sink;
5—Insulating Part.

DETAILED EMBODIMENTS OF THE INVENTION

The exemplary embodiments will now be described more fully with reference to the accompanying drawings, to further illustrate the object, solution and effects of the present disclosure, but shall not be understood as a limitation to the claimed extent of protection.

Some terms are used in the specification and subsequent claims to refer to specific components or parts. Those skilled in the art should understand that the technical user or manufacturer can call the same component or part with different nouns or terms. This specification and subsequent claims do not take the difference in name as the way to distinguish components or parts, but take the difference in function of components or parts as the criterion to distinguish. "Including" and "including" mentioned in the entire description and subsequent claims are open-ended terms, so they should be interpreted as "including but not limited to". In addition, the term "connection" herein includes any direct and indirect means of electrical connection. Indirect electrical connection means include connection through other devices.

It is noted that in the description of the present disclosure, the azimuth or positional relationship or parameters indicated by the terms "transverse", "longitudinal", "upper", "lower", "front", "rear", "left", "right", "vertical", "horizontal", "top", "bottom", "inner", "outer" and "about", or "about", "substantially", "left and right", are based on the azimuth or positional relationship shown in the attached drawings, It is only for the convenience of describing the present disclosure and simplifying the description, and does not indicate or imply that the device or element must have a specific orientation, a specific size, or be constructed and operated in a specific orientation. Therefore, it cannot be understood as a limitation of the present disclosure.

Figure 1:
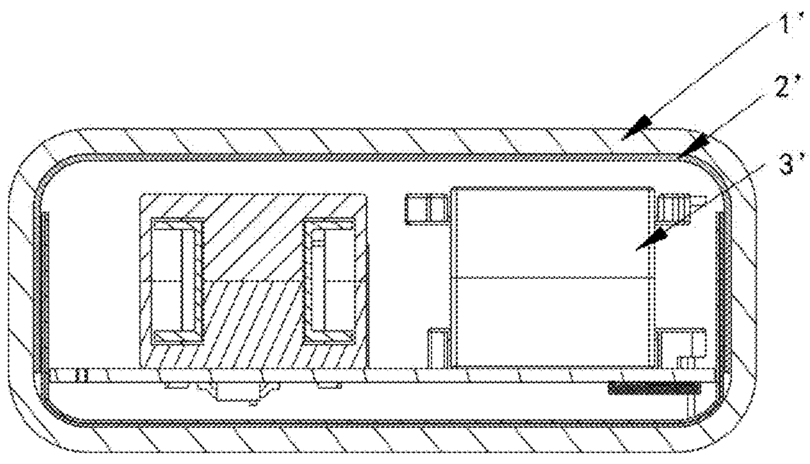
FIG. 1 is a schematic diagram showing a heat dissipation structure for an AC adapter in the prior art.

Referring to FIG. 1, in the first method of the heat dissipation in the prior art, a metal heat sink 2' is attached around an electronic assembly 3'. The metal heat sink 2' is secured to a surface of a heat-generating element in the electronic assembly 3'. The heat generated by the internal heat-generating element is transferred to a plastic housing 1' through the metal heat sink 2'. Then, the plastic housing 1' radiates the heat into the air to dissipate the heat. However, due to possible assembly gaps between the metal heat sink 2' and the plastic housing 1', and a relative large thermal resistance of the plastic housing 1', the heat dissipation is poor. As a volume of an AC adapter becomes smaller, and an arrangement of internal electronic elements becomes more compact, a space for attaching the heat sink is to be more limited. As a result, the heat dissipation efficiency in the AC adapter is not desirable.

Figure 2:
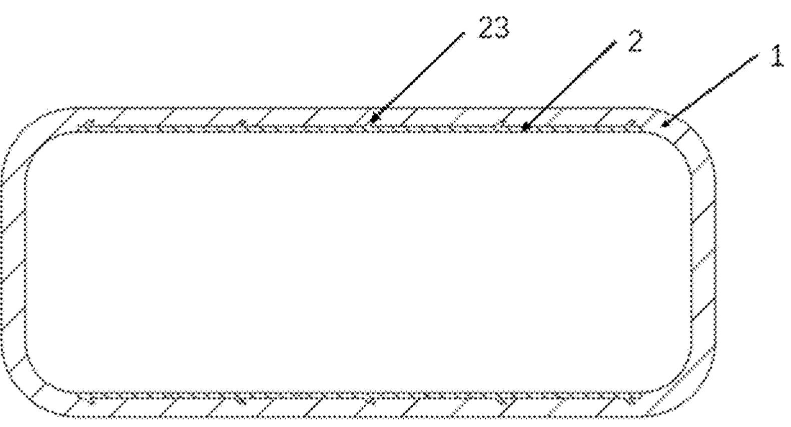
FIG. 2 is a schematic diagram showing a heat dissipation housing according to an embodiment of the present disclosure that is integrally formed and includes a securing structure.
Figure 3:
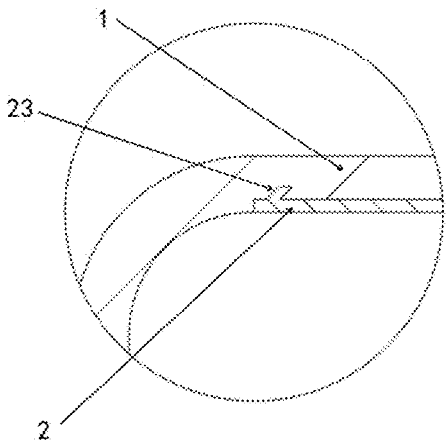
FIG. 3 is a partial enlarged view showing the heat dissipation housing according to the embodiment of the present disclosure that is integrally formed and includes the securing structure.

To implement a structure with increased heat dissipation area and enhanced heat dissipation capability, a heat dissipation housing for an AC power adapter according to an embodiment of the present disclosure is provided, as shown in FIGS. 2 to 3. The heat dissipation housing includes a housing 1 and a heat sink 2. The heat sink 2 is disposed on an inner surface of the housing 1. The heat sink 2 and the housing 1 are integrally formed. In some embodiments, the heat sink 2 and the housing 1 are integrally molded by injection molding. The heat sink 2 includes an upper surface and a lower surface. The upper surface of the heat sink 2 is in close contact with the housing 1, for example by the injection molding. The lower surface of the heat sink 2 is exposed to the inside of the heat dissipation housing. The heat sink 2 further includes at least one securing structure 23, as shown in FIG. 3. The securing structure 23 is formed by the upper surface of the heat sink 2 for combining the heat sink 2 with the housing 1 more tightly. In the embodiment, it is noted that the housing 1 may cover on a periphery of an AC power adapter, for example, as a plastic housing. The heat sink may be, for example, a metal heat sink. Further, the metal heat sink may be made of, for example, but not limited to, copper or aluminum. In the embodiment, the metal heat sink may be embedded into the inner surface of the plastic housing, and may be integrally formed with the plastic housing, for example by the injection molding. The integrally formed heat dissipation housing for the AC power adapter according to the present disclosure has a high thermal conductivity. Since the metal heat sink of better heat dissipation capability is embedded, the heat generated by the electronic element may be transferred to the outside through the heat dissipation housing more efficiently, as compared with conventional plastic housings. Further, at least one securing structure is formed on the metal heat sink embedded in the housing, which prevents the heat sink from falling off, combines the heat sink with the plastic housing more tightly, and thus improves structural stability of the integrally formed heat dissipation housing.

It is noted that the heat sink 2 may be embedded into one side or each side of the inner surface of the housing 1 for the AC power adapter, depending on requirements on the heat dissipation. That is, the heat sink 2 may be arranged on the whole inner surface of the housing 1. Alternatively, in some embodiments, the heat sink 2 may be arranged on part of the inner surface of the housing 1. For example, as shown in FIG. 2, the heat sinks 2 may be embedded into an upper side and a lower side of the inner surface of the housing 1. Alternatively, the heat sink 2 may be embedded into the upper side and a left side of the inner surface of the housing 1. The present disclosure is not specifically limited to it. As compared with the conventional plastic housings, since the metal heat sink having a lower thermal resistance is embedded, heat conduction efficiency of the heat dissipation housing is improved, allowing to transfer the heat around from local hot spots, and thereby improving temperature homogeneity over the surface of products. In some embodiments, the heat sink 2 may have a flat plate plate shape, or a cylinder shape to match the shape of the housing 1.

Figure 4:
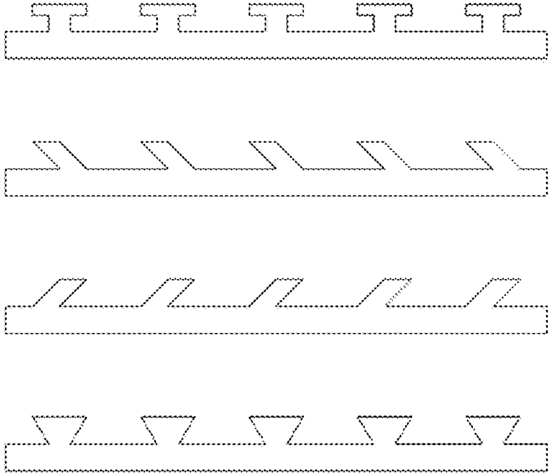
FIG. 4 is a cross-sectional diagram showing a heat sink having a barb structure on the upper surface according to an embodiment of the present disclosure.

Further, referring to FIGS. 2 to 4, the securing structure 23 on the heat sink 2 may have a barb structure, for example, to allow the heat sink to be in close contact with the plastic housing, so as to prevent the heat sink 2 from falling off from the housing 1 and thus to improve the structural stability of the integrally formed heat dissipation housing. It is noted that the position and number of the barb structure 23 are not specifically limited in the present disclosure. For example, the barb structure 23 may be arranged in the middle of the heat sink 2, or may be arranged on any side of the heat sink 2. Specifically, the heat sink 2 may include multiple securing structures 23 and the securing structures 23 are arranged on two sides of the heat sink 2. In some embodiments, the barb structure 23 may include at least one of the T-shaped structure, an inverted trapezoidal structure, or a rod-shaped structure at an angle to a surface of the heat sink 2, as shown in FIG. 4. For example, two barb structures may be formed on the upper surface of the heat sink 2, with one being a T-shaped barb structure and the other being an inverted trapezoidal structure, or both being the T-shaped barb structure, or both being the inverted trapezoidal structure. It is understood that the barb structure 23 is not limited to those structures mentioned above, and other structures may be used as long as they allow close contact with the housing and prevent the heat sink from falling off.

Figure 5:
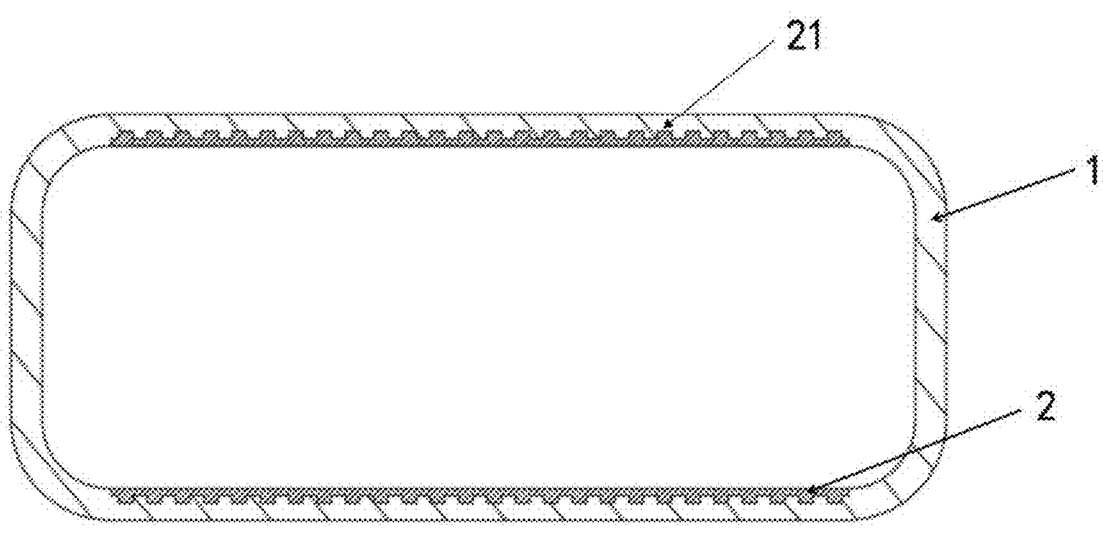
FIG. 5 is the structural diagram of the heat dissipation housing of the AC adapter according to another embodiment of the present disclosure.
Figure 6:
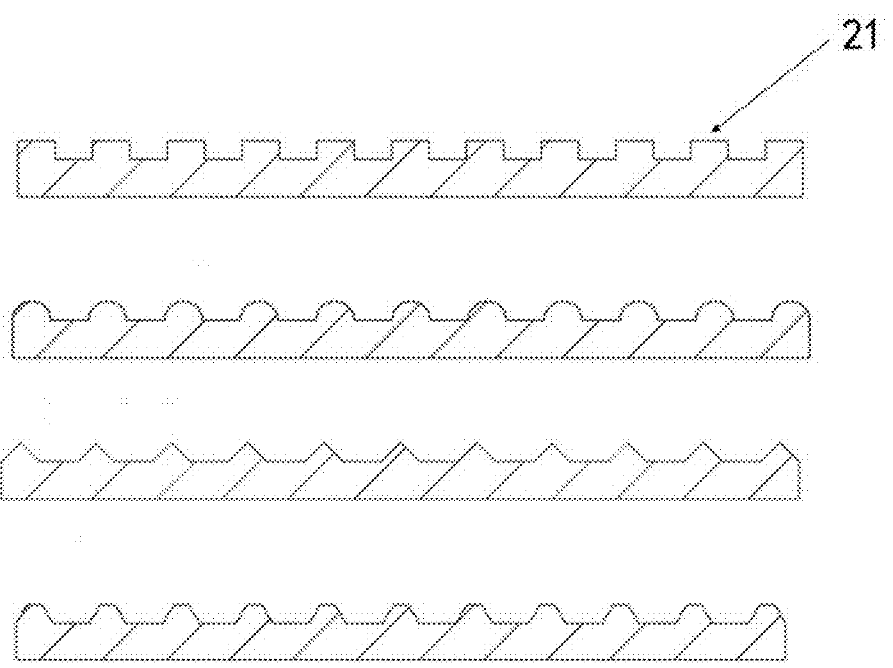
FIG. 6 is a cross-sectional diagram of a heat sink having an uneven upper surface according to an embodiment of the present disclosure.

In some embodiments, referring to FIGS. 5 to 6, a surface of the heat sink 2 on a side which is opposite to a side facing a power supply assembly requiring the heat dissipation, i.e., the upper surface of the heat sink 2, is uneven. Further, the uneven surface of the heat sink 2 is formed by protrusions 21 and/or grooves with certain shapes. In the embodiment, for example, the shape of the protrusions 21 may include at least one of a rectangle shape, a semicircle shape, a triangle shape, or a trapezoid shape, as shown in FIG. 6, but is not limited to them. Similarly, the shape of the grooves may include at least one of the rectangle shape, the semicircle shape, the triangle shape, or the trapezoid shape, for example, but is not limited to them. In the embodiment, the contacting portion between the embedded heat sink 2 and the housing 1 is uneven, which may increase the heat dissipation area of the heat sink, increasing the contact area between the heat sink and the plastic housing, improving the heat dissipation capability of the heat dissipation housing, and greatly improving the heat dissipation efficiency.

Figure 7:
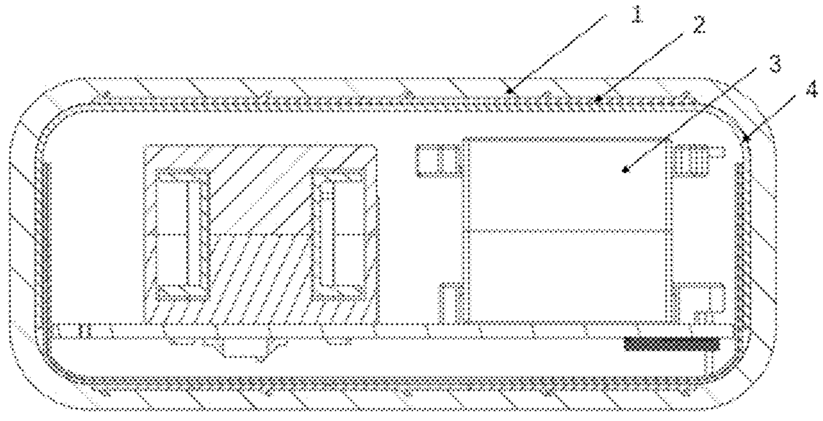
FIG. 7 is a structural diagram showing an AC power adapter including the heat dissipation housing shown in FIG. 2 according to an embodiment of the present disclosure.
Figure 8:
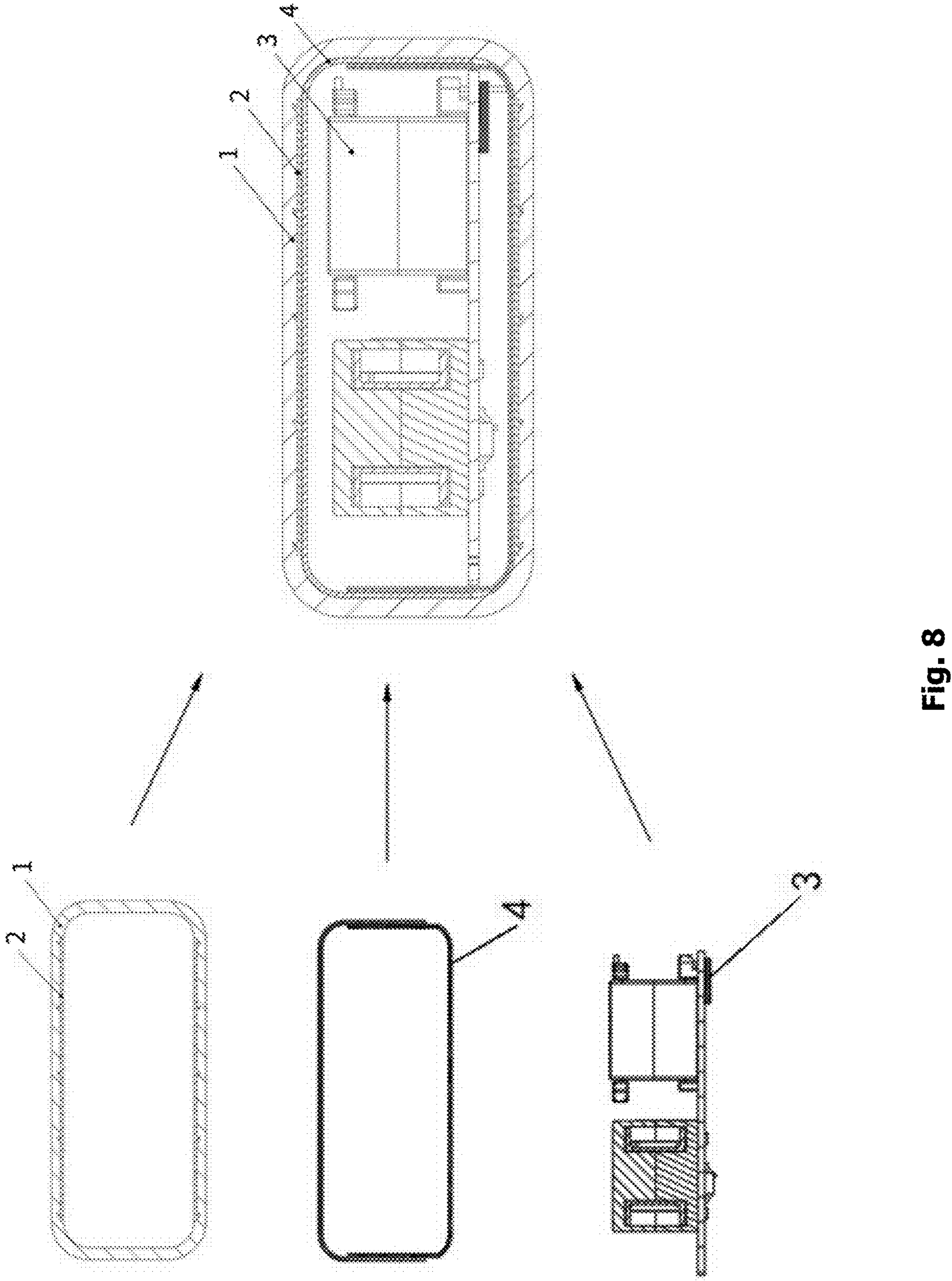
FIG. 8 is a composition diagram showing the AC power adapter shown in FIG. 7 of the present disclosure.

An AC power adapter including the heat dissipation housing for the AC power adapter as described in the above embodiment shown in FIGS. 2-6, is further provided according to the present disclosure. Further, as shown in FIGS. 7 to 8, the AC power adapter further includes a power supply assembly 3 and an inner heat sink 4. The power supply assembly 3 is disposed in a cavity formed by the heat dissipation housing, and includes a circuit board and electronic element arranged on the circuit board. The inner heat sink 4 is disposed on an periphery of the power supply assembly 3 and secured to the power supply assembly 3.

Figure 9:
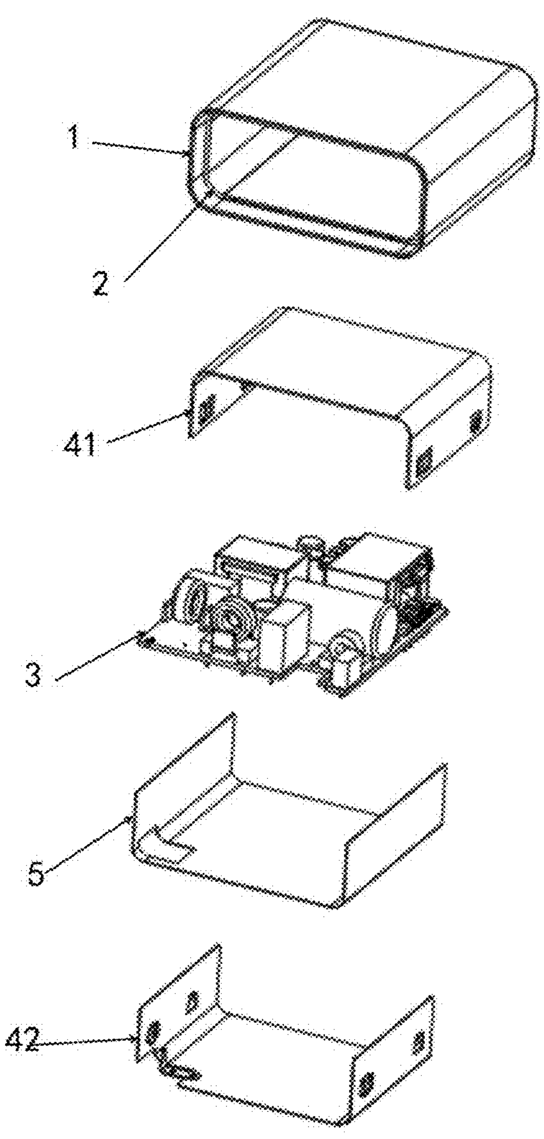
FIG. 9 is an explosion diagram showing the AC power adapter shown in FIG. 7 of the present disclosure.
Figure 10:
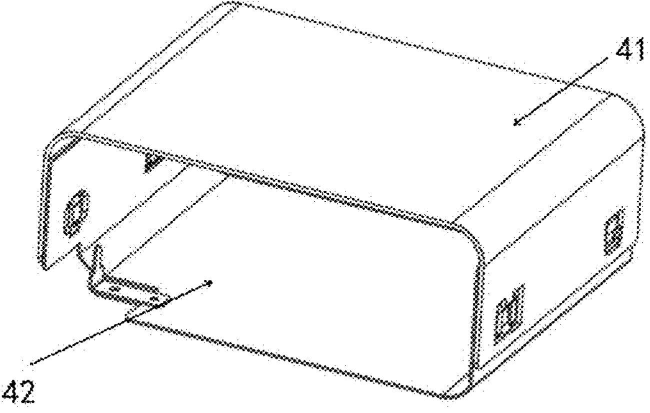

In some embodiments, referring to FIGS. 9 to 10, the inner heat sink 4 may have a cylinder shape. The inner heat sink 4 in the cylinder shape may be integrally formed, i.e., as an integral body, or may be formed by buckling two U-shaped heat sinks, such as a first U-shaped heat sink 41 and a second U-shaped heat sink 42. In some embodiments, the inner heat sink 4 may include one or more heat sinks, each having a plate shape and being disposed corresponding to a surface of the power supply assembly 3, so that the inner heat sink 4 may be arranged along a periphery of the power supply assembly 3. In some embodiments, a lower surface of the heat sink 2 in the heat dissipation housing that is exposed to the inside of the heat dissipation housing may be in direct contact with one or more surfaces of the inner heat sink 4, which greatly improves the overall effects of heat dissipation.

In some embodiments, the inner heat sink 4 is secured to the circuit board of the power supply assembly 3 shown in FIG. 7, e.g., via securing feet, but is not limited to it. Further, an insulating part 5 is disposed between the inner heat sink 4 and the power supply assembly 3, such as an insulating sheet or an insulating tape.

The heat dissipation housing for the AC power adapter according to the present disclosure provides a groundbreaking solution in the field of heat dissipation for the AC adapter, which provides a heat dissipation housing structure with better heat dissipation effects, and solves a problem of overheating in the housing of the power adapter. To implement a structure with increased heat dissipation area and enhanced heat dissipation capability, a scheme in which a metal heat sink is embedded into a plastic housing is adopted. The metal heat sink and the plastic housing may be integrally formed, for example by injection molding, to achieve a better heat dissipation capability. Further, the embedded metal heat sink is provided with a securing structure for preventing the metal heat sink from falling off, combining the metal heat sink with the plastic housing more tightly, and thus improving structural stability of the heat dissipation housing.

Further, the heat dissipation housing for the AC power adapter according to the present disclosure has a high thermal conductivity. As compared with conventional plastic housings, since the metal heat sink having a lower thermal resistance is embedded, heat conduction efficiency is improved, allowing to transfer the heat around from local hot spots, and thereby improving temperature homogeneity over the surface of products. In this way, the heat generated by electronic element may be transferred to the outside effectively through the heat dissipation housing.

Further, there is a larger contact area between the heat sink and the housing in the heat dissipation housing for the AC power adapter according to the present disclosure. The heat sink embedded in an inner wall of the housing may have a plate shape or a tubular shape. Part of the contact surface between the heat sink and the housing may be uneven, e.g., formed by protrusions and/or grooves with various shapes. By using the heat sink with uneven surface, a heat dissipation area of the heat sink may be increased such that a contact area between the heat sink and the housing may be increased, which increases heat transferring efficiency and enhancing heat dissipation capability of the heat dissipation housing.

The above is only a preferred embodiment of the present disclosure, and is not a limitation of the present disclosure in other forms. Any technician familiar with the profession may use the above disclosed technical content to change or modify it into an equivalent embodiment of the same change, which can be applied to other fields. However, any simple modification to the above embodiment according to the technical essence of the present disclosure without departing from the technical scheme of the present disclosure Equivalent changes and modifications still belong to the protection scope of the technical scheme of the present disclosure.

What is claimed is:

1. An AC power adapter, comprising:
a heat dissipation housing, comprising:
a housing; and
a heat sink disposed on an inner surface of the housing, and integrally formed with the housing; and
an inner heat sink,
wherein the heat sink comprises an upper surface which is in contact with the housing, and a lower surface which is exposed to an inside of the heat dissipation housing,
wherein the heat sink comprises at least one securing structure which is formed by the upper surface of the heat sink,
wherein the heat sink is embedded into at least a portion of the inner surface of the housing,
wherein the entire heat sink is disposed inside the housing,
wherein the housing is made of plastic,
wherein the heat sink is integrally formed with the housing by injection molding,
wherein the inner heat sink has a tubular shape, and is integrally formed or formed by buckling two U-shaped heat sinks, and
wherein one or more surfaces of the inner heat sink is in direct contact with the lower surface of the heat sink of the heat dissipation housing.

2. The AC power adapter according to claim 1, wherein the at least one securing structure is formed in a barb structure.

3. The AC power adapter according to claim 2, wherein the barb structure comprises at least one of a T-shaped structure, an inverted trapezoidal structure, or a rod-shaped structure at a certain angle to a surface of the heat sink.

4. The AC power adapter according to claim 1, wherein the heat sink is disposed on all or part of the inner surface of the housing.

5. The AC power adapter according to claim 1, wherein the heat sink has a tubular shape.

6. The AC power adapter according to claim 1, wherein the heat sink is made of copper or aluminum.

7. The AC power adapter according to claim 1, further comprising:
a power supply assembly disposed inside a cavity formed by the heat dissipation housing, and comprising a circuit board and an electronic element arranged on the circuit board, and
wherein the inner heat sink disposed on a periphery of the power supply assembly and secured to the power supply assembly.

8. The AC power adapter according to claim 7, wherein the inner heat sink comprises one or more inner heat sinks, each being disposed corresponding to a surface of the power supply assembly.

9. The AC power adapter according to claim 7, wherein an insulating part is disposed between the inner heat sink and the power supply assembly.

* * * * *